(12) United States Patent
David et al.

(10) Patent No.: US 7,387,081 B2
(45) Date of Patent: Jun. 17, 2008

(54) PLASMA REACTOR INCLUDING HELICAL ELECTRODES

(75) Inventors: Moses M. David, Woodbury, MN (US); Michael C. Gifford, Menomenie, WI (US)

(73) Assignee: 3M Innovative Properties Company, St. Paul, MN (US)

( * ) Notice: Subject to any disclaimer, the term of this patent is extended or adjusted under 35 U.S.C. 154(b) by 349 days.

(21) Appl. No.: 10/349,844

(22) Filed: Jan. 23, 2003

(65) Prior Publication Data

US 2004/0144314 A1     Jul. 29, 2004

(51) Int. Cl.
*C23C 16/00* (2006.01)
*H01L 21/306* (2006.01)

(52) U.S. Cl. .............. 118/723 E; 118/718; 118/723 R; 156/345.43; 156/345.47

(58) Field of Classification Search ............ 118/718, 118/719, 723 R, 723 E, 723 ER, 723 I, 723 IR, 118/723 AN; 156/345.43, 345.46, 345.47, 156/345.48, 345.49
See application file for complete search history.

(56) References Cited

U.S. PATENT DOCUMENTS

| | | | |
|---|---|---|---|
| 4,402,993 A | | 9/1983 | Aisenberg et al. |
| 4,405,435 A | * | 9/1983 | Tateishi et al. ........ 204/298.25 |
| 4,492,716 A | * | 1/1985 | Yamazaki .................. 438/483 |
| 4,593,644 A | * | 6/1986 | Hanak ........................ 118/719 |
| 4,728,406 A | | 3/1988 | Banerjee et al. |
| 4,763,601 A | * | 8/1988 | Saida et al. ................. 118/718 |
| 4,786,352 A | * | 11/1988 | Benzing ................ 156/345.48 |
| 5,234,723 A | | 8/1993 | Babacz |
| 5,281,247 A | | 1/1994 | Aikawa et al. |
| 5,288,329 A | * | 2/1994 | Nakamura et al. .......... 118/729 |
| 5,320,659 A | | 6/1994 | Ishiguro et al. |
| 5,349,154 A | | 9/1994 | Harker et al. |
| 5,738,771 A | * | 4/1998 | Yoshida ................. 204/298.24 |
| 5,758,006 A | * | 5/1998 | Neely ......................... 385/137 |
| 5,965,216 A | | 10/1999 | Neuberger et al. |
| 6,136,386 A | | 10/2000 | Nakahigashi et al. |
| 6,432,492 B2 | | 8/2002 | Weichart |
| 2002/0051613 A1 | | 5/2002 | Singh et al. |
| 2004/0076393 A1 | | 4/2004 | Singh et al. |

FOREIGN PATENT DOCUMENTS

| | | |
|---|---|---|
| GB | 2 105 371 A | 3/1983 |
| JP | 5-106053 | 4/1993 |
| JP | 05-202481 A | 8/1993 |
| JP | 11222530 A | 8/1999 |
| WO | WO 01/66484 A1 | 9/2001 |

* cited by examiner

*Primary Examiner*—Luz L. Alejandro
(74) *Attorney, Agent, or Firm*—Daniel R. Pastirik

(57) ABSTRACT

A device for forming an ion sheath in a plasma to deposit coatings on a non-conducting substrate. The device comprises a tubular reaction chamber having an outer surface wound helically with a first electrode having a first width. Helical winding of the first electrode provides a plurality of first wraps around the outer surface of the tubular reaction chamber. The device further includes a second electrode having a second width that is larger than the first width. Helical winding of the second electrode provides a plurality of second wraps alternating with the first wraps around the outer surface of the tubular reaction chamber. An ion sheath in a plasma forms to a thickness extending at least to the longitudinal axis of the tubular reaction chamber when the first electrode has a connection to a source of radio-frequency power and the second electrode provides a path to ground.

8 Claims, 3 Drawing Sheets

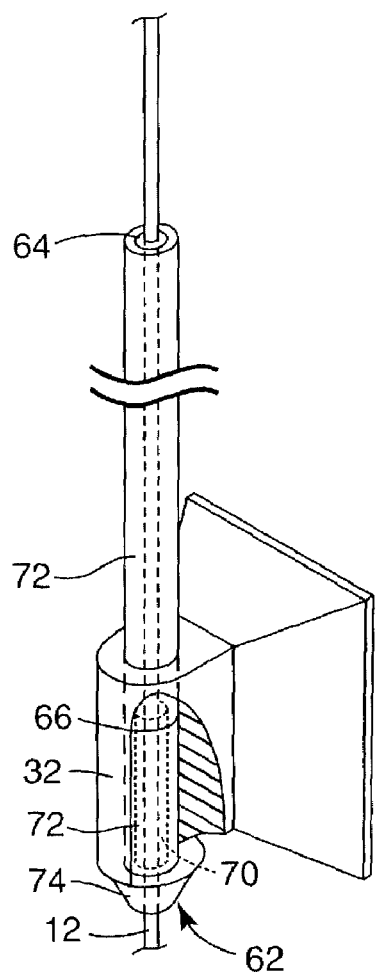
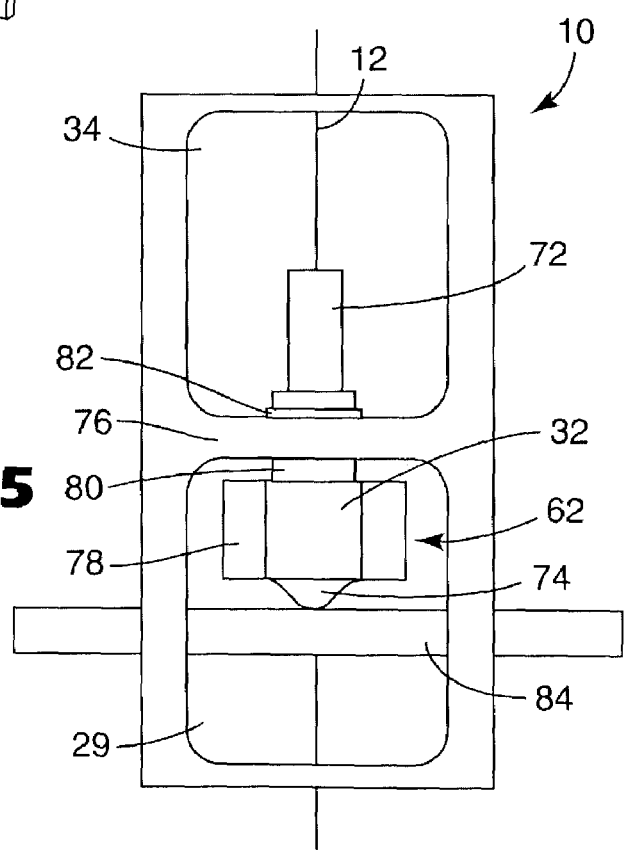
FIG. 4
FIG. 5

PLASMA REACTOR INCLUDING HELICAL ELECTRODES

BACKGROUND OF THE INVENTION

1. Field of the Invention

The invention relates generally to coated optical fibers and to a device and method for contacting and positioning lengths of uncoated optical fiber for application, by chemical vapor deposition, of amorphous or metal coatings without adverse effect upon the strength characteristics of the uncoated optical fibers. More particularly the present invention provides a coating apparatus including a plasma reactor in the form of a tubular reaction chamber having powered and grounded electrodes wound helically on the outer surface of the tubular reaction chamber. The present invention further provides a fiber guide formed by freezing a layer of liquid, preferably water, to provide a solid collar that acts as a bearing for linear movement of a fiber along a prescribed axis during application of amorphous material, including diamond-like glass coatings, inside low pressure reaction chambers.

2. Description of the Related Art

Manufacture of optical fibers, used for formation of optical fiber refractive index gratings, typically involves drawing glass filaments from highly photosensitive glass pre-forms. The process uses a down-feed system to control the rate at which the photosensitive pre-form and cladding enters the heating zone of an induction furnace. Heating zone temperatures reach from about 2200° C. to about 2250° C. Within this temperature range an optical pre-form may be drawn to the filamentary form of an optical fiber. A laser telemetric measurement system monitors the diameter of the optical fiber and its position in the draw tower. Thereafter, the newly formed optical fiber passes to one of more coating stations for application of at least one UV curable, protective coating. The protective coating, commonly referred to as a buffer coating, prevents damage that a buffer-free optical fiber may sustain by physical impact or contact with environmental contaminants including water and aqueous solutions. Historically it has not been possible to touch uncoated glass fibers without degrading their strength. For this reason, fiber optic draw towers have a height to accommodate fiber formation and application of protective buffer coatings before the optical fiber reaches the bottom of the tower. Although damage by contact with bare optical fibers can occur in a fraction of a second, buffer coatings provide sufficient protection to fragile optical fibers to allow them to be wound around storage drums and held for further processing.

Subsequent processing of a coated optical fiber may include formation of a refractive index grating in its core to produce useful articles including narrow band retro-reflectors, gain flattening devices in optical amplifiers and wavelength filters in optical communication systems. Refractive index gratings include periodic variations of refractive index that may be described as adjacent parallel planes of alternating higher and lower refractive index. The process for forming refractive index gratings requires coated optical fibers containing dopant materials, such as germanium oxide, that increase the sensitivity of the optical fiber to changes in refractive index resulting from exposure to actinic radiation e.g. from an ultraviolet laser. Without pre-sensitization, the fabrication of refractive index gratings by exposure to actinic radiation may require impractical, extended exposure times in the path of the laser beam. The degree of development and magnitude of index of refraction modulations depends upon the photosensitivity of the absorbing silica or glass structure during exposure to actinic radiation. Conventional polymeric buffer coatings, which are preferred for protecting the optical fiber, absorb actinic radiation and interfere with formation of index of refraction modulations. Removal of protective buffer, even if only from a portion of its length, returns the bare portion of the optical fiber to a vulnerable condition in which damage may occur as the stripped optical fiber undergoes modification to produce a desired refractive index grating device. Vulnerability to damage persists until the bare portion of an optical fiber receives a protective recoat of buffer material.

Formation of refractive index gratings in an optical fiber, including a glass core and an overlying cladding layer of a similar glass composition, is possible without exposing the optical fiber to impact or contaminants that might adversely affect the original physical strength characteristics of the fiber. The threat of damage may be overcome using a coating of diamond-like carbon, diamond-like glass or an amorphous coating of similar structure that forms a protective layer, transparent to ultraviolet radiation, over optical fiber cladding. Published application WO 01/66484 A1 describes diamond-like coatings and methods for their application to protect optical fibers having suitable sensitivity to radiation from an ultraviolet laser for introduction of refractive index gratings into the optical fiber core.

The challenge with the use of diamond-like coatings is the retention of the original physical strength of a drawn optical fiber during application of the coating in vapor deposition chambers operating at reduced pressure. U.S. Pat. No. 4,402,993 describes a process for coating optical fibers immediately following fiber formation using conventional drawing techniques. Optical fibers, fed directly from a fiber extruder, pass through an appropriate protective shroud to the entry of an elongated chamber having inert gas air locks at its opposite ends. Between the pressure locks, the optical fiber passes successively through a series of evacuated chamber sections. The first section comprises a plasma-ion milling zone for removing contaminants and microscopic defects from the surface of the optical fiber. Next the cleaned optical fiber passes into a second zone wherein elemental carbon, propelled in plasma-ion form, coats the surface of fiber with a diamond-like elemental carbon film of submicron thickness. At various points through the coating apparatus the optical fiber passes through plates having orifices of a size that is larger than the diameter of the optical fiber. To prevent damage to the fiber, by impact or abrasion against the sides of an orifice, the coating apparatus uses an inert gas positioning vortex to control gas flow between cleaning and coating zones.

The use of an inert gas vortex is one method for positioning bare optical fibers as they pass between chambers operating at different pressures. Another method uses seals that prevent gas transfer between chambers. However, during movement between pressure-controlled chambers, optical fibers roll over the seals producing a rubbing motion that could also lead to fiber weakening. A coating process typically uses monitoring equipment to sense conditions such as vibration that could damage the fiber. These precautions reduce the probability that the strength characteristics of the drawn optical fiber will decrease during application of hermetically sealed coatings.

The process described in U.S. Pat. No. 4,402,993 uses a coating chamber operating at reduced pressure to allow plasma ion formation around an electrode structure inside the coating chamber. U.S. Pat. No. 5,234,723 describes generation of plasma activated species inside a coating chamber using a single electrode wrapped spirally around the outside of the coating chamber. The use of the external electrode allows treatment of particles with plasma-activated species to apply functional coatings to the particles. Japanese published application JP 11222530 describes plasma processing to produce polymer coated metal wire passing through a tubular chamber wrapped with a single electrode. The powered electrode is twisted spirally around the outside of the tubular chamber and the metal wire provides the other electrode for plasma generation at atmospheric pressure. Japanese Published Application JP 5106053 describes generation of a low pressure glow plasma discharge following introduction of a reactive gas into one end of an insulator tube that has a pair of spirally wrapped parallel electrodes wrapped around its outer periphery. The low-pressure glow discharge plasma etches the surface of substrates inside the tube. Preferably, the insulator tube consists of glass, plastics such as PTFT, FEP, PET, PPS, PEEK, ABS, and silicone and ceramics. The spiral of the parallel pair of electrodes may be made from Cu, Ag, Ni, Al, stainless steel, carbon etc., which are separated from each other at a distance of preferably 5-20 mm. The helical wraps of the electrode pair have a separation of 20 cm. A 50 cm diameter Pyrex discharge tube 3 mm in thickness provided the insulator tube for uniform etching of silicon wafers. A low pressure glow plasma discharge, of the type described, etches substrates, such as silicon wafers, which may be stationary or moving inside or located on the inner surface of a ceramic, plastic or glass insulator tube.

A coated optical fiber having at least one protective buffer layer applied to its surface may be the starting material for a vapor deposition process that applies a coating to an optical fiber. In this case, application of a layer of diamond-like glass, for example, requires removal of any coating over the cladding of an optical fiber. The process used to remove coating from the clad optical fiber, e.g. before imprinting a Bragg grating, represents one more operation that could adversely affect the strength of a delicate single mode, optical fiber that typically comprises a core less than 1 µm in diameter and a cladding layer that increases the diameter to about 125 µm.

There is increasing use of fiber optics in applications including information transmission and optoelectronic devices. Considering the number of conditions under which damage may occur to delicate optical fibers there is a need for processes and related equipment that suppress any decrease in strength characteristics from levels associated with newly drawn optical fibers.

SUMMARY OF THE INVENTION

The present invention provides a fiber guide for positioning and eliminating vibration from an optical fiber during processing. A fiber guide forms by freezing a layer of liquid, preferably water, to provide a solid collar that acts as a bearing and provides tension control for linear movement of the fiber along a prescribed axis during application of coating material using a variety of material coating techniques including chemical vapor deposition. Even though long-term exposure to water is known to damage uncoated optical fibers, ice in contact with an uncoated optical glass fiber does not degrade the strength of the fiber thereby providing a significant benefit of an ice bearing according to the present invention. An ice bearing allows processing of bare optical glass fibers to manipulate, position and tension them as needed to apply coatings that may require the fiber to pass between processing stations at atmospheric pressure and processing stations operating under vacuum, such as chemical vapor deposition coaters.

While not wishing to be bound by theory, it is believed that at least two characteristics of ice bearings according to the present invention prevent loss of optical fiber strength. It is known that ice expands during freezing and liquefies under pressure. A bearing, in its frozen condition, provides support for any portion of an optical fiber surrounded by it. The use of a bearing, which is frozen in place, provides several advantages because the exact position and geometry of the fiber are not critical, and may change slowly during processing without causing damage to the fiber. Although an optical fiber has freedom of passage through a fiber guide, there is essentially no frictional heating or contact between the ice and the glass because of a fluidized layer of water between the ice bearing and the surface of the optical fiber. The fluidized layer represents a layer of liquid lubrication.

The water layer provides lubrication at the surface of ice at temperatures close to freezing. If the temperature drops too far below freezing the bearing will have a tendency to remain dry, which may cause loss of the benefit of an ice bearing for positioning a portion of a length of bare optical fiber. In a temperature range from about −40° C. to about −0.2° C. the interface between an ice bearing and a glass optical fiber allows movement of the optical fiber under controlled tension. Currently, the ice bearing, or fiber guide revealed herein, is the only structure that can contact a stripped or uncoated glass fiber without damaging it. Even low surface energy, soft lubricating materials such as TEFLON® induce damage and loss of strength of an optical fiber. The amount of damage and loss of strength varies according to the geometry and hardness of the lubricating material and the pressure of contact against the surface of an optical fiber. A further disadvantage of lubricating bearings, such as TEFLON®, is the formation of a contaminating residue on a processed optical fiber. The residue interferes with adhesion and quality of coatings applied to an optical fiber. In contrast, water is the only residue associated with contact with an ice bearing according to the present invention. Evaporation of pure water leaves no contaminating residue on a processed optical fiber.

Another advantage of the use of fiber guides according to the present invention is the substantially constant renewal of the interfacial layer of water as the optical fiber passes through the orifice formed in the ice bearing. As long as the purity of the water is controlled, the bearing will likewise have a controlled composition and cleanliness. This self-cleaning aspect of a fiber guide, formed from ice, overcomes problems of reusing other types of lubricating bearings, which require periodic removal of accumulated debris.

Processes that involve contact between materials, including water or ice, and the bare surface of a glass fiber would be expected, by one of ordinary skill in the art, to cause reduction in the strength of the glass fiber. According to the present invention an interfacial layer of water provides lubrication without reacting with the unprotected glass in a way that degrades the strength characteristics of the glass. While water is typically considered to adversely affect optical fiber strength, optical fiber processing, according to the present invention, limits contact between glass and water to short contact times that do not cause significant strength degradation.

A fiber guide or ice bearing according to the present invention may be used advantageously for damage free processing of an optical fiber. Its use is described herein with reference to the application of transparent, diamond-like glass coatings to the surface of an optical fiber. It will be appreciated by those skilled in the art that the ice bearing may be used in other applications. Such applications fall within the scope of the present invention.

Processing of optical fibers for application of diamond-like glass according to the present invention has a number of steps including continuous removal of acrylate coating from the fiber, and rinsing the fiber with water before passing it through a fiber guide or ice bearing into a chemical vapor deposition chamber to apply a coating of diamond-like glass. After threading an optical fiber through the processing equipment, the formation of an ice pressure bearing requires temperature reduction in the region of a water droplet or water column held by surface tension between the surface of the fiber and the bottom of a support tube located between the water rinse station and the chemical vapor deposition chamber. Reduction of temperature below $-5°$ C. in the region of the water droplet or column, using super-cooled air or a thermoelectric cooling apparatus, causes either the water droplet itself or at least a portion of the water column to freeze around the optical fiber. As the water freezes, to form the ice pressure bearing, it seals the bottom of the support tube producing a closed system, including the vapor deposition chamber, in which pressure can be reduced to facilitate plasma coating of the stripped optical fiber. Subsequent preparation of the vapor deposition chamber includes evacuation of the chamber and initiation of flow of suitable process gases including hydrocarbons, organosilanes, fluorocarbons, and mixtures thereof. Deposition of diamond-like glass films, for example, uses a process gas comprising a mixture of tetramethylsilane and oxygen using volume ratios in a range between about 0.1 and about 5.0. As used herein the terms diamond-like glass film is interchangeable with diamond-like glass coating.

One embodiment of a vapor deposition chamber according to the present invention comprises a tubular reaction chamber. A double helix electrode system, around the outside of the tubular reaction chamber, provides an asymmetric electrode arrangement that develops a large negative bias potential across the smaller electrode to produce a local electric field perpendicular to any point along the longitudinal axis of the tubular reaction chamber. An optical fiber, located coaxially at the center of the tubular reaction chamber, will be surrounded by the ion sheath of a plasma, and subject to ion bombardment, when the radius of the tubular reaction chamber is smaller than the thickness of the ion sheath.

A preferred embodiment of a vapor deposition chamber, according to the present invention, is a device for forming an ion sheath in a plasma to deposit coatings on a substrate particularly a non-conducting substrate such as an optical fiber. The device comprises a tubular reaction chamber having an outer surface and a first electrode having a first width.

The first electrode is wound helically to provide a plurality of first wraps around the outer surface of the tubular reaction chamber. A second electrode has a second width that is larger than the width of the first electrode. The second electrode is wound helically to provide a plurality of second wraps alternating with the first wraps around the outer surface of the tubular reaction chamber. The ion sheath in the plasma forms to a thickness extending into the tubular reaction chamber, at least to the longitudinal axis thereof, when the first electrode has a connection to a source of radio-frequency power and the second electrode provides a path to ground.

Typically the tubular reaction chamber is made of glass having a radius less than about 25.0 mm, optionally less than about 12.0 mm, but preferably less than the thickness of the ion sheath in the plasma.

More particularly, the present invention provides a filament guide comprising a support tube having an internal wall defining an axial channel to receive a length of a filament. The axial channel provides containment for a filament closure, surrounding at least a portion of the filament and in contact with at least a portion of the internal wall. The filament closure includes a portion of frozen fluid, such as water that provides an ice bearing having an orifice formed therein to allow movement of the length of the filament therethrough. Suitable filaments include non-conducting filaments especially optical fibers.

A filament guide may be used as a device for positioning a portion of a length of bare optical fiber for application of coating material. The device, in one embodiment, comprises a column of a fluid, such as water, surrounding the portion of the length of bare optical fiber and has at least one fiber guide including at least one frozen layer of the column of the fluid. The at least one fiber guide includes an orifice sized to the cross-sectional dimensions of the portion of the length of bare optical fiber to allow movement of the length of bare optical fiber therethrough, positioned for the application of coating material.

The device for positioning a portion of a length of bare optical fiber for application of coating material may comprise a tube containing a column of water including a fiber entry and a fiber exit. The tube has an orientation inside an optical fiber processing column to position the column of water in coaxial relationship with the longitudinal axis of the processing column to surround the portion of the length of bare optical fiber. A fiber guide, formed by freezing a layer of the column of water, occupies a position at the fiber entry to support the column of water. The fiber guide includes an orifice sized to allow movement of the portion of the bare optical fiber therethrough for application of coating material to the length of bare optical fiber.

The invention further provides a process for depositing a layer of material on an optical fiber. Process steps include providing a supply of an optical fiber having at least one buffer coating and threading the optical fiber through a processing column to an accumulator for a treated optical fiber. The processing column includes an entry to receive the optical fiber and a pressure control exit for passage of the treated optical fiber to the accumulator. Also, the processing column further includes a reaction chamber between the entry and the exit. Optical fiber is dispensed from the supply through the entry into an acid bath containing a heated acid to remove buffer coating from the optical fiber to provide a stripped optical fiber. The stripped optical fiber is transported through a tube including a fiber entry and a fiber exit The tube has an orientation inside the processing column to position the tube to contain a fluid, such as water, to surround a portion of the stripped optical fiber in coaxial relationship with the longitudinal axis of the processing column. Cooling at least a portion of the fluid to a temperature below its freezing point seals the processing column for pressure reduction during formation of a frozen closure or fiber guide around the portion of the stripped optical fiber. The frozen closure includes an orifice allowing movement of the stripped optical fiber therethrough. After evacuating the processing column between the frozen closure and the pressure control exit, a flow of a process gas (e.g. tetramethyl silane and oxygen in a ratio from about 0.1 to about 5.0) is maintained at low pressure through the reaction chamber. The reaction chamber comprises a tube wrapped helically with a first electrode and a second electrode. Application of power at a radiofrequency to the first electrode and connecting the second electrode to ground generates an ion sheath of a plasma for ion bombardment to deposit the layer of material, such as diamond-like glass, on the stripped optical fiber as it moves through the reaction chamber. This provides the treated optical fiber for collection by the accumulator.

BRIEF DESCRIPTION OF THE DRAWINGS

Notwithstanding any other forms, which may fall within the scope or the present invention, preferred forms of the invention will now be described, by way of example only, with reference to the accompanying drawings in which:

FIG. 4 provides a partially cutaway perspective view of a frozen fluid fiber guide or ice bearing according to the present invention.

FIG. 5 provides a diagrammatic representation of detail portion 5 of FIG. 1 showing positioning of a frozen fluid fiber guide in a processing column according to the present invention.

DETAILED DESCRIPTION OF THE INVENTION

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a basis for the claims and as a representative basis for teaching one skilled in the art to variously employ the present invention.

Figure 1:
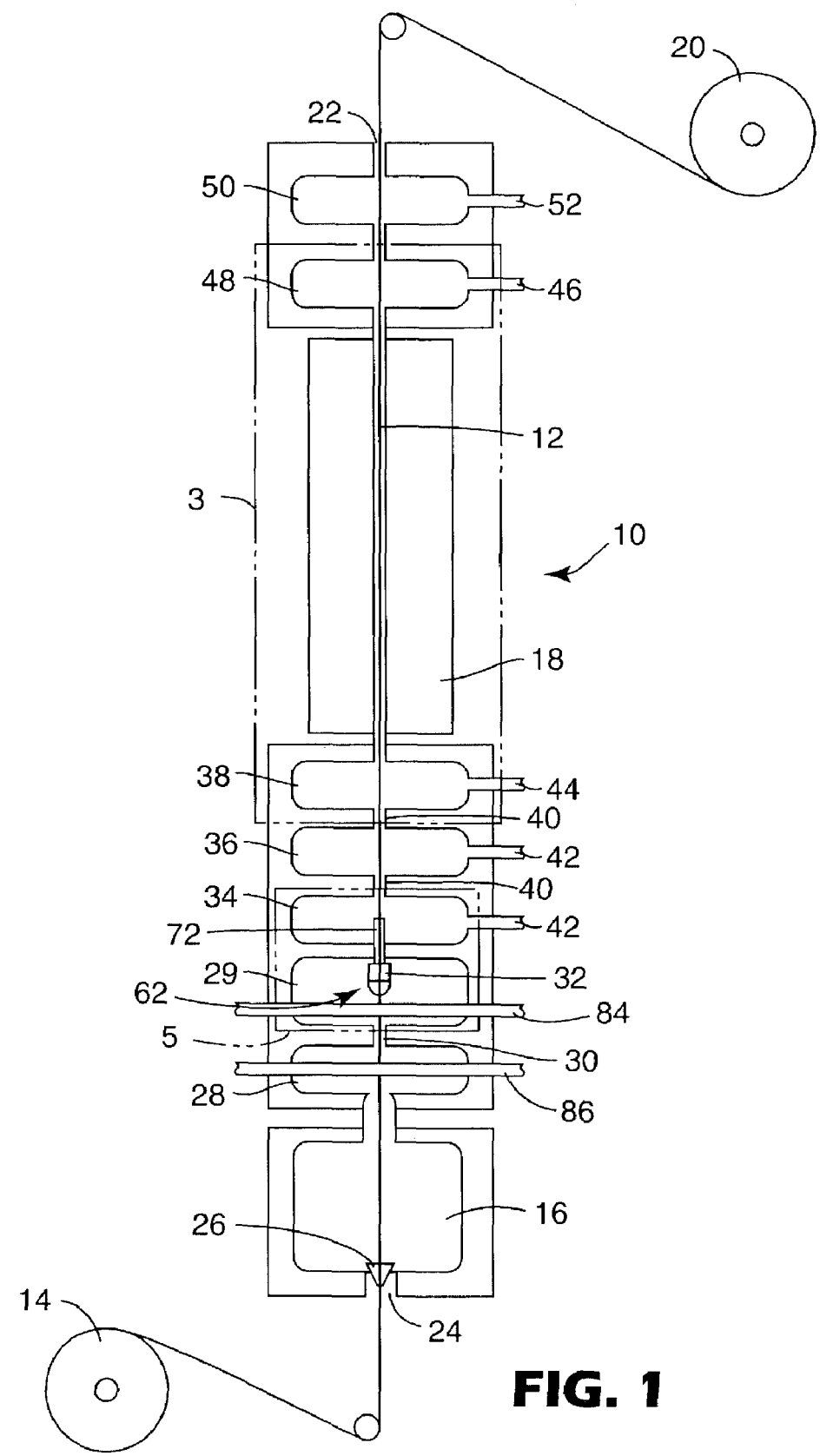
FIG. 1 is a schematic diagram of processing equipment for removing buffer coatings from an optical fiber followed by application of a diamond-like coating to the stripped optical fiber.

Referring now to the figures wherein like numerals refer to like parts throughout the several views, FIG. 1 is a schematic diagram of an apparatus 10 for applying a diamond-like film-deposit on filamentary substrates, particularly uncoated optical fiber 12 substrates. The apparatus includes an unwind spool 14 as a source of optical fiber 12 that passes through an acid bath 16, during removal of protective buffer layers, then travels upwards through a vapor deposition chamber 18 for application of a diamond-like glass coating. A take-up spool 20 collects the optical fiber 12 that emerges from the upper exit 22 of the apparatus 10 after processing. Although discussed herein with reference to coated optical fibers, including layers of protective buffer, it is possible to deposit diamond-like coatings directly on an optical fiber 12 fed from the top to the bottom of a reactive plasma chamber 18 as it exits from a draw furnace used to fabricate the fiber from a silica preform.

The application of a diamond-like coating to a filament in the form of an optical fiber 12 may employ the apparatus 10 for continuous processing of the optical fiber 12 during transport between the unwind spool 14 and the take-up spool 20. Treatment of an optical fiber 12 according to the present invention requires changes to the surface of the optical fiber 12 at several points in the fiber's 12 journey through the processing equipment 10. The diagram of FIG. 1 combines several processing stations into a single piece of equipment 10 orientated vertically so that a coated optical fiber 12, fed from the unwind spool 14, enters the base of the equipment 10 that provides a containment column for seriatim completion of each processing step.

A first processing station is an acid bath 16 containing hot concentrated (98%) sulfuric acid, at an elevated temperature of preferably 180° C., to remove buffer coatings from the coated optical fiber 12 in preparation for application of a diamond-like glass coating. The lower entry 24 to the sulfuric acid container has a TEFLON® pass-through 26 that provides a leak-proof optical fiber access to the acid container 16. After removal of the coating, the stripped glass optical fiber 12 enters a first water rinse station 28 for removal of residual acid. The washed optical fiber 12 leaves the exit 30 and passes through a final water rinse tube 84 before entering an open channel through a tube 72 that leads to the first of a series of evacuation chambers 34, 36, 38, that may be evacuated for progressive reduction in pressure from about 98.8 KPa (760 torr) to about 39.0 Pa (0.3 torr). At the entrance of each chamber, a gas-lock 40 seals a given chamber from adjacent chambers to maintain a given pressure differential between chambers 34, 36, 38.

As shown in FIG. 1, gradual reduction from atmospheric pressure to a pressure of about 39.0 Pa (0.3 torr) preferably uses three evacuation chambers 34, 36, 38, the first 34 of which operates at about 3.9 KPa (30 torr) to about 13.0 KPa (100 torr), preferably about 9.75 KPa (75 torr). A second evacuation chamber 36 further lowers the pressure to between about 0.5 KPa (4.0 torr) and about 0.9 KPa (7.00 torr), preferably about 0.65 KPa (5.0 torr). Transition to a third evacuation chamber 38 drops the pressure to between about 26.0 Pa (0.2 torr) and about 39.0 Pa (0.3 torr), which is the preferred pressure range for chemical vapor deposition of diamond-like coatings, and is in the required range for developing a plasma for chemical vapor deposition. Each of the evacuation chambers 34, 36, 38, has a connection to a vacuum manifold 42 adapted to maintain a specified reduced pressure.

The third evacuation chamber 38 occupies a position at the base of a reaction chamber 18 and has a connection to an exhaust manifold 44 for removal of process gases. At the upper end of the reaction chamber a gas supply manifold 46 supplies reactive gases that form a plasma, inside the reaction chamber 18, for deposition of diamond-like coatings. The gas supply manifold 46 feeds a gas supply chamber 48 that leads to a terminal evacuation chamber 50, which also connects to a vacuum manifold 52 to remove gas from the reaction chamber 18. As a result, the reaction chamber 18 maintains the low pressure between about 26.0 Pa (0.2 torr) and about 39.0 Pa (0.3 torr). Suitable materials for the reaction chamber 18 include materials having a low sputter yield, which means that very little contamination of the diamond-like film occurs from the chamber surfaces. Preferably the reaction chamber 18 is fabricated from a dielectric material such as glass or quartz or aluminum oxide or selected polymers. The use of the reaction chamber 18 illustrated in FIG. 1 is one of a number of means for providing a controlled environment at reduced pressure for containment of gas used for plasma creation, ion acceleration, and film deposition.

Figure 2:
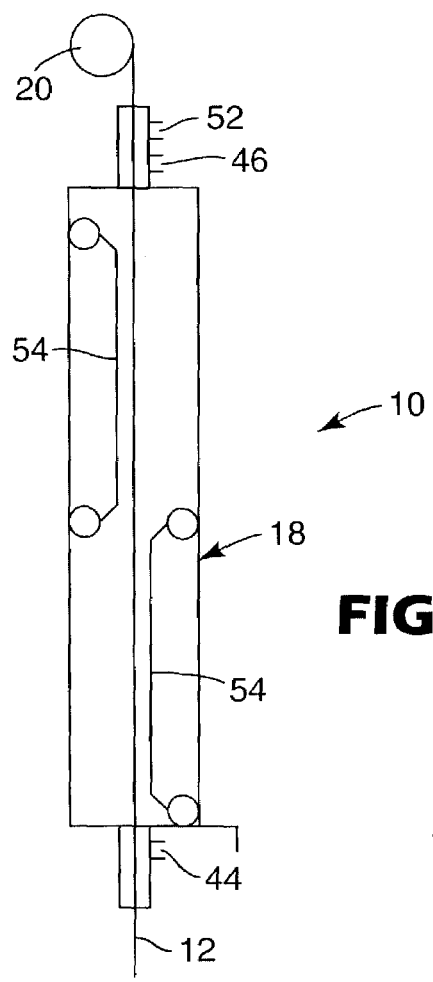
FIG. 2 is a schematic diagram showing electrodes inside a reaction chamber used for deposition of diamond-like films.

FIG. 2 provides a diagram of an apparatus that may be contained in a reaction chamber 18 for deposition of diamond-like films on a substrate. Vapor deposition inside a grounded reaction chamber uses a pair of aluminum electrodes 54, nominally 610 mm (24 inches) long and 38 mm (1.5 inches) wide, either one or both of which may be energized at radio-wave frequencies. The electrodes 54 lie along the linear axis of the chamber 18 one above the other, in a staggered arrangement. A substrate, such as an optical fiber 12, occupies a position adjacent to at least one of the electrodes 54 with a separation depending on the conditions selected for diamond-like film deposition. Construction of the reaction chamber 18 allows evacuation of its interior during containment of a fluid for plasma creation, ion acceleration, and film deposition. As described previously, exhaust and vacuum manifold connections 44, 52, to the reaction chamber 18, maintain a desired reduced pressure within the reaction chamber 18.

Figure 3:
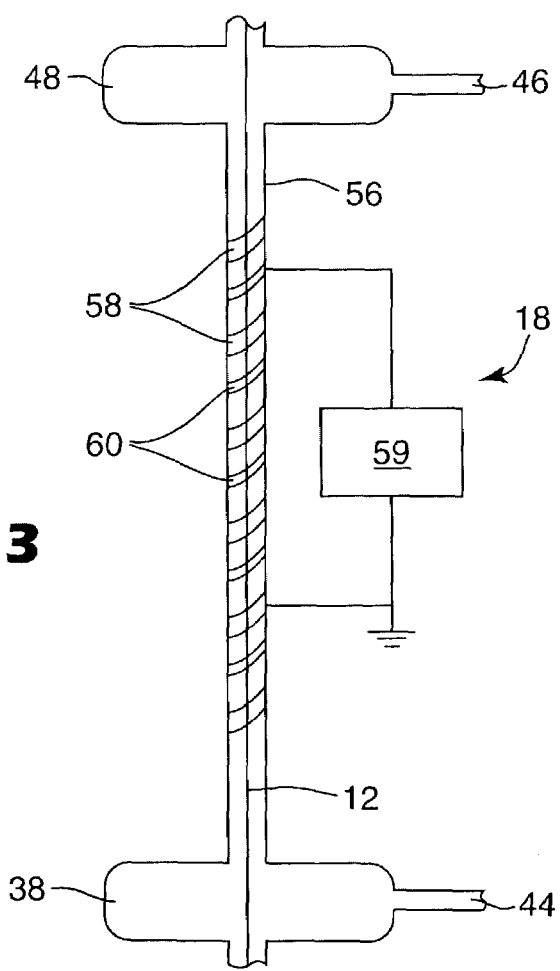
FIG. 3 shows a schematic diagram of a tubular reaction chamber corresponding to detail section 3 of the processing equipment of FIG. 1.

FIG. 3 provides a diagrammatic illustration of a preferred plasma reactor 18 for treatment of non-conducting particles and filaments. A reactor 18 of this type may be used according to the present invention for application of a diamond-like glass (DLG) coating to an optical fiber. As illustrated, the present embodiment provides a compact reactor 18 having a simplified structure compared to conventional plasma reactors. The compact reactor 18, corresponding to detailed section 3 of FIG. 1, includes a tubular reaction chamber 56 that may be readily interchanged when it becomes contaminated. The reaction chamber 56, in this case, comprises a small-diameter glass tube having a pair of electrodes 58, 60, helically wound along its outer surface. One of the helical electrodes 58 is wider than the other electrode 60 so that a capacitively coupled plasma creates an asymmetric discharge within a length of the glass tube 56 after connecting the narrower electrode 60 to a source of radio-frequency power 59 and the wider electrode 58 to ground. The asymmetric discharge forms a helical ion sheath around an optical fiber 12 as it passes through the glass tube 56 during application of a diamond-like glass film. Adjustment of the position of the helical ion sheath, surrounding the narrower helical electrode 60, depends upon the diameter of the glass tubular reaction chamber 56. Preferably the diameter of the glass tube 56 positions the ion sheath to extend into the glass tube 56 beyond its longitudinal axis. An optical fiber 12, centered coaxially inside the glass tube 56, becomes exposed to the ion-sheath and to reactive ions that bombard the surface of the optical fiber 12. Surface bombardment, using suitable gaseous materials to form an ion-induced plasma, allows processing of non-conducting, fibrous substrates for chemical vapor deposition of diamond-like glass films. Ion bombardment is important to achieve a diamond-like glass film deposit on a substrate. Plasma etching apparatus, as described in Japanese Published Application JP 5106053 includes one powered electrode and one grounded electrode but appears unsuitable for depositing diamond-like glass films due to the large diameter (50 cm) of the insulator tube. A reactor tube of this type may produce an ion sheath about 5.0 cm thick to satisfy requirements for plasma etching, but is not expected to provide ion bombardment as needed to apply a diamond-like glass film according to the present invention.

A preferred material for chemical vapor deposition, according to the present invention, uses a mixture of tetramethylsilane (TMS) and oxygen to deposit diamond-like glass coatings on the surface of an optical fiber as it passes through the reaction chamber. The TMS to oxygen flow ratio may be chosen at between 0.1 and 5.0, preferably between 0.5 and 2.0, most preferably between 0.8 and 1.5

A tubular reaction chamber 56, as described herein, produces an ion-induced plasma that occupies the region around a threaded optical fiber 12. Suitably positioned, a helical ion sheath extends lengthwise along a portion of the optical fiber 12 during treatment by ion bombardment. Helically wrapped electrodes 58, 60, also produce a coating having circumferential uniformity. This characteristic provides improvement over reactive chambers 18 with planar electrodes, as shown in FIG. 2, in which there is a directional dependence of deposition. Uniform material deposition over the cylindrical surface of an optical fiber, in this case, requires rotation of the substrate or suitable placement of multiple electrodes. A helical ion sheath provides a plasma confined more effectively to the region around an optical fiber 12 for effective ion bombardment and uniform deposition of a diamond-like glass composition to provide a transparent, protective layer over the surface of the fragile optical fiber 12.

After threading an optical fiber 12 through the tubular reaction chamber 56 or past the electrodes 54 of the diamond-like glass deposition equipment 10, the formation of an ice pressure bearing 62 (see FIG. 1) requires temperature reduction in the region of a water droplet or water column. FIG. 4 and FIG. 5 illustrate a structure suitable for formation of an ice bearing 62 that may be described in general terms as a water column 64 held inside a plastic tube 72 so that it surrounds an optical fiber 12 extending above and below the plastic tube 72. The plastic tube 72 is held by friction in a channel 66 of the support tube 32 located between two chambers 29, 34 of the deposition equipment 10, as shown in FIG. 1. Reduction of temperature below −5° C. at the lower end of the plastic tube 72 produces a frozen section of the water column 64 that includes a frozen droplet 74, having the shape of an inverted rounded cone joined to a frozen cylinder 70 that extends inside the plastic tube 72. Means for freezing the section of the water column 64 include impingement of a jet of super-cooled air or thermoelectric cooling of the support tube 32 surrounding the plastic tube 72. A stream of super-cooled air provides effective cooling when there is an insulating layer between the support tube 32 and a wall mount 78 used to attach the support tube 32 to the surface of the deposition equipment 10. In a preferred embodiment of a frozen filament guide 62 according to the present invention, a thermoelectric cooler provides the means for freezing water in the water column 64. Suitable thermoelectric cooling equipment includes a unit designated as UT6-7-30-F1, available from Melcor Thermoelectrics of Trenton, N.J. This cooling unit may be secured to the surface of the chamber 29 by any one of a variety of securing means including adhesive bonding using, for example, thermally conductive epoxy adhesive # TC 2707 available from 3M Company, St. Paul, Minn. Installation of the thermoelectric cooling unit, in the vapor deposition equipment 10, includes connection of the hot side of the thermoelectric cooler either to a heat sink, or directly to the frame of the chamber 29 containing the ice bearing 62. Thereafter, the thermoelectric cooler operates under control of a 60 Watt Series 800 cooler available from Alpha Omega Instruments, Cumberland, R.I., using a CO1-E style 1 thermocouple available from Omega Engineering, Stamford, Conn., as a temperature sensor mounted to the cooled support tube, 32.

The use of suitable methods for cooling causes at least a portion of the water column 64 to freeze around the optical fiber 12. As it freezes, to form the ice bearing 62, the frozen water droplet 74 seals the bottom of the support tube 32 producing a closed system in which pressure can be reduced to facilitate coating of the stripped optical fiber 12 via chemical vapor deposition of a layer of diamond-like glass. An ice bearing 62 may include a layer of water added to the plastic tube 72 after formation of the frozen droplet 74. One embodiment of the present invention has an ice bearing 62 as a completely frozen water column 64 formed around the optical fiber. Thereafter, preparation of the reaction chamber 18 includes introduction of a gas flow to flush the chamber 18 and fill it with a selected process gas mixture comprising tetramethylsilane and oxygen. The flow rate of the gases is adjusted and maintained by mass flow controllers (MFC) available from MKS Instruments, Andover, Mass. A roots blower (Model EH1200, available from Edwards High Vacuum, Sussex, England), backed by a mechanical pump (Model E2M80, also available from Edwards High Vacuum, Sussex, England) removed gas from the reaction chamber 18, through the vacuum manifolds.

Pressure adjustment by a butterfly valve, located between the reaction chamber 18 and a vacuum pump, provides a means for controlling the pressure in the reaction chamber 18 independent of the process gas flow rate. A throttle valve and controller (Models 653 and 600 series respectively, available from MKS Instruments, Andover, Mass.) may be used to maintain the pressure at a value, suitable for plasma deposition, between about 0.13 Pa and 130 Pa (0.001 to 1.0 torr), preferably about 26.0 Pa (0.2 torr) and about 39.0 Pa (0.3 torr). Gas flow rates depend upon the internal volume of a reaction chamber 18, whereby larger chambers require higher flow rates to achieve the same dwell time for the gas mixture in the chamber 18.

Application of power, at radio frequencies typically about 13.56 MHz, to the electrodes 54, 60, sets up a radio-frequency plasma discharge in which the powered electrode becomes negatively biased. This bias is generally in the range of 100 to 1500 volts. This biasing causes ions within the oxygen-rich plasma to accelerate toward the electrode to form an ion sheath.

Accelerating ions from the oxygen-rich plasma form a deposit on the non-conducting substrate, preferably an optical fiber 12.

Films of diamond-like glass require a process gas, for the plasma discharge chemical vapor deposition process, containing a mixture of tetramethylsilane and oxygen. The gas mixture reacts to produce a surface deposit, which has a complex three dimensional structure dependent upon the ratio of the components of the process gas. Variation of conditions including pressure, radio-frequency power, gas type and concentration, and electrode size produces a change in vapor deposition rate. In general, deposition rates increase with increasing radio-frequency power, and process gas pressure and concentration.

Films deposited according to the invention provide protection for the glass fibers without substantial loss of fiber strength. Film deposits typically have a thickness in the range from about 1 micron to about 100 microns, preferably from about 2 microns to about 10 microns. Highly transparent, diamond-like glass films may be deposited thicker than the preferred range without excessive attenuation of light. Diamond-like glass may be deposited on optical fibers, for example, to a thickness of 100 microns to provide a strong fiber structure without compromising write-through properties required for formation of fiber optic gratings using known means, including an interferometer or a phase mask, to write a periodically varying refractive index grating within the core of a fiber. The reflectivity, reflection bandwidth, and wavelength of such a grating structure are simply defined by the period and length of the phase mask and exposure time used.

FIG. 4 provides an illustration of a tube 32 containing a channel 66 to hold a plastic tube 72 containing a column of water 64 having at least a layer 70 thereof frozen to form an optical fiber guide or ice bearing. The tube 32 may be mounted to the wall of the processing equipment 10 as indicated in FIG. 1 that shows location of the ice bearing 62 in a chamber 29 between the water rinse station 28 and the first evacuation chamber 34. In a preferred embodiment, the chamber 29 includes a water supply tube 84 providing a second rinsing station, just before a processed fiber 12 passes into an ice bearing 62. As illustrated in FIG. 4, a cutaway portion at the bottom of the channel 66 indicates the position of a layer of ice 70 as a solid portion of an ice bearing 62 according to the present invention. The ice bearing 62, formed by cooling water from about −40° C. to about −0.2° C., establishes a pressure barrier and a support that stabilizes the optical fiber 12 from vibration and protects its bare surface from damage as the optical fiber 12 passes from the chamber 29, at atmospheric pressure, into the reduced pressure region adjacent to the chemical vapor deposition chamber 18 before collection of the coated optical fiber at the take-up spool 20. An optical fiber 12 entering the first evacuation chamber 34 through an ice bearing 62 according to the present invention moves from an environment at atmospheric pressure to an environment at a lower pressure of about 9.75 KPa (75 torr). The use of an ice bearing 62 overcomes a number of problems with a conventional restricted orifice used for pressure adjustment. A pressure differential across a conventional orifice causes movement of gas through the orifice that induces vibration in the fiber. Depending on its amplitude, a vibrating optical fiber 12 makes contact with the walls of the orifice. Impact between a fiber 12 and the walls of the orifice has been shown to reduce the strength of an optical fiber 12. The intensity of the vibration induced in the fiber is a function of tension and length of the fiber, and the density and flow of the gas. The gas flow rate and characteristics typically include turbulence, and are a function of the pressure drop, and the orifice geometry. With useful fiber lengths greater than about one meter and tensions less than about one kilogram, a pressure drop across an orifice from about 98.8 KPa (760 torr) to less than about 85.6 KPa (650 torr) produces turbulence that induces fiber-damaging vibration. Conversely, an ice bearing 62 allows pressure to be decreased in the first chamber 34 to between about 0.66 KPa (5 torr) and about 13.0 KPa (100 torr), without damaging the fiber. At pressures below about 13.0 KPa (100 torr), the density of the process gas is such that no damage due to fiber-displacement occurs. This allows the use of conventional restricted orifices between the first evacuation chamber 34 and later evacuation chambers 36, 38. Orifices of about 0.35 mm (0.09 inch) to about 0.24 mm (0.06 inch) may be used to provide the desired pressure differential without fiber damage. Use of conventional restricted orifices at these points is preferred because frozen water bearings are subject to evaporation or sublimation at pressures required for chemical vapor deposition.

FIG. 5 provides detail of the location of an ice bearing 62 between two chambers 29, 34 of deposition equipment 10 also referred to herein as a processing column. The diagram of FIG. 5 shows a support tube 32 extending below an intervening wall 76. A bracket 78 provides a means for attaching the support tube to the rear wall of the processing column 10. A seal 80, preferably a TEFLON® seal, provides a gas-tight seal 80 between the intervening wall 76 and the plastic tube 72 that extends through the seal 80 into the evacuation chamber 34. A snap ring 82 provides a retaining means for the gas tight seal 80. Protruding from the lower end of the tube 32, attached to the plastic tube 72, is an inverted rounded cone 74 of ice that was a partially formed droplet of water before freezing. The ice droplet 74 hangs above a final rinse tube 84 used during removal of residual acid from the optical fiber 12. Use of a final rinse tube 84 provides an optical fiber surface prepared for application of a coating by chemical vapor deposition. Chemical vapor deposition according to the present invention may also include a first rinse tube 86 (see FIG. 1.) as a first station for removal of acid contamination from the surface of an optical fiber 12. Rinse tubes 84, 86, include axially aligned, upper and lower holes, each having a diameter about 0.35 mm (0.09 inch), through which the fiber passes. The axially-aligned holes have a diameter large enough to allow clearance for an optical fiber but small enough that capillary force allows the water to pass in either direction through a rinse tube 84, 86, flowing over the fiber, without draining out.

Frozen fluid fiber guides 62, particularly those produced by freezing water, facilitate other aspects of optical fiber processing such as the relative ease with which an optical fiber 12 may be positioned and accurately tensioned without damage to the fragile fiber. Using an ice bearing 62, it is possible to dispense with previously used techniques for avoiding strength degradation of optical fibers. Such techniques included raising the tension on the optical fiber, or reducing the length of a fiber span between supports or increasing the number of evacuation chambers, thereby reducing turbulent gas flow, or increasing the size of the opening through which the optical fiber passes. This latter processing technique was impractical due to increased power requirements and additional equipment, including extra vacuum pumps and evacuation chambers to maintain pressure levels below 130 Pa (1.0 torr).

The concept of a solidified fluid fiber guide 62 is not restricted to handling of optical fibers alone but may also be applied to other types of filament, particularly those susceptible to surface damage. As a further extension of the fiber guide concept according to the present invention the possibility exists for fabrication of articles such as fiber turning-fixtures, which act as pulleys for surface sensitive filaments. Such fixtures could be made with an ice surface having contours to permit turning and festooning of filaments. Festooning or wrapping of filaments in the form of optical fibers may allow the use of shorter towers for drawing and otherwise processing optical fibers. The versatility and length of short processing towers may be effectively increased using appropriate threading to increase the amount of filament that may be processed in a single pass. Such threading effectively increases the length of older tower structures that may otherwise require rebuilding. Frozen fluid guides offer benefits for on-tower application processes that are impractical at current speeds, for example the coating of optical fibers with polyimide coating formulations.

EXPERIMENTAL

Example 1

The purpose of this example is to demonstrate that, under controlled conditions, a bare, stripped or otherwise uncoated glass fiber may be repeatedly reciprocated in contact with melting ice, or tapped against it, without noticeably altering the strength characteristics of the glass fiber.

Twenty samples of 3M #303 optical fiber, each two-meters in length, were treated using concentrated sulfuric acid at a temperature of 165° C. to strip buffer coating from the optical fibers to produce bare, uncoated portions approximately two inches long. The stripped portions of the optical fibers were rinsed in water and isopropyl alcohol, after which the processed lengths of optical fiber were stored in boxes to avoid touching the exposed glass.

Seven of the stripped fibers were rubbed to and fro across cubes of melting ice obtained from the freezer portion of a domestic refrigerator. The fibers were gripped by hand on either side of the stripped region and moved back and forth under approximately 455 g (one pound) of tension applied by drawing the fibers downwards, across the upper corners of an ice cube, at angles between 10° and 45°. Differing numbers of strokes of optical fibers against the surface of ice cubes were investigated, at room temperature, as a function of the resulting strength of a test fiber. Bare portions of optical fibers, rubbed over an ice cube from ten times to fifty times, retained substantially the same strength as stripped control fibers that were not placed in contact with ice. Samples testing included tapping them against the surface of ice. This is a qualitative test method in which an optical fiber, having a stripped central portion, was held by its coated ends under a tensile force of about 455 g (one pound). Table 1 includes the results of repeatedly contacting the central stripped portion of optical fiber test samples with a corner or face of an ice cube.

In an optional test method, stripped portions of three more optical fibers were captured between two ice cubes and stroked back and forth approximately 100 times before being removed from the ice.

Another test, involving three stripped optical fibers, was conducted in a cold storage room containing ice blocks at −40° C. As before, samples of stripped optical fibers were stroked against the surface of the −40° C. ice blocks to determine if this procedure had any effect upon the strength of the test fibers.

All samples tested at room temperature or at −40° C. were evaluated for tensile strength by pulling to failure as sections of 0.5 meter gauge length. Test samples were 1.5 meters in length of which a 0.5 meter length, at each end of each sample, was wrapped around a 10.0 cm (4 inch) diameter aluminum mandrel, which had previously been covered with #411 double-sided adhesive tape (available from 3M Company, St. Paul, Minn.). Application of a driving force to the mandrels causes the central 0.5 meter gauge length to be extended at a fixed rate selected from either 0.5 mm or 1.0 mm per minute. All test samples retained strength values in excess of 600 KPSI at failure. No appreciable change was apparent comparing the breaking strength of the ice treated samples to control samples subjected only to acid stripping.

Comparative Example C1

The procedure described for Example 1 was repeated using surfaces of clean TEFLON® instead of ice. After 50 strokes, back and forth, against these alternative surfaces, the majority of test fibers showed significant loss of strength when pulled to failure. Results in Table 1 show that testing, by tapping stripped fibers against the surface of TEFLON®, was almost as damaging as rubbing of fibers, as described previously.

TABLE 1

Qualitative Tensile Strength Testing of Optical Fibers

| | | Tensile Strength at Failure (KPSI) | | |
|---|---|---|---|---|
| Surface | Method | Maximum | Minimum | Comment |
| Ice | Rub | 700 | 600 | |
| Ice | Tap | 700 | 680 | |
| Teflon | Rub | 680 | 50 | 90% < 350 kpsi<br>75% < 200 kpsi |
| Teflon | Tap | 680 | 90 | 70% < 350 kpsi<br>55% < 200 kpsi |

Example 2

Following qualitative studies of the effect of ice in contact with stripped optical fibers, the use of an ice pressure bearing was investigated in equipment used to coat diamond-like glass on stripped optical fiber at reduced pressures associated with chemical vapor deposition of material.

A tubular reaction chamber was constructed using a PYREX® glass tube, 122 cms (four feet) long, having an internal diameter of approximately 1.00 cm (0.4 inch). A pair of electrodes was wrapped helically around the outside of the glass tube for a length of approximately 91.5 cm (three feet) to provide the tubular structure shown in FIG. 3. The electrode-wrapped tube provided the low-pressure plasma reactor used to deposit diamond-like glass coatings on stripped optical fibers threaded through the optical fiber processing equipment shown in FIG. 1.

The use of two electrodes, wrapped as a double helix around the outside of the tubular reaction chamber, provides a localized electric field at any point along the span of the tube covered by the pair of electrodes. Preferably the powered electrode is not as wide as the grounded electrode. Under the conditions for plasma formation, the plasma extends into the tube in a direction transverse to the longitudinal axis of the tubular reaction chamber. Ion bombardment, for depositing dense diamond-like glass films on stripped optical fiber, required the use of a tubular reaction chamber having a radius less than the thickness of the ion sheath of the plasma. With this arrangement it will be appreciated that a centrally positioned optical fiber, moving progressively through the tubular reaction chamber, becomes immersed in the ion sheath thereby facilitating deposition of coating material on the surface of a non-conducting substrate.

A tubular reaction chamber, including a double helix of wrapped electrodes, according to the present invention was used to coat from about 35.0 m (120 ft) to about 45.0 m (150 ft) of a stripped optical fiber with diamond-like glass, at a rate of about 25 cm/minute (9 inches/minute), using a powered electrode operating at 60 W. Electrode power was provided by a Model RF 5S power supply, Model AM-10 matching network and a Model AMNPS controller, all available from Rf Power Products, Kresson, N.J. The resulting DLG film was about 2 microns in thickness. Four separate treatments, under these conditions, deposited diamond-like glass coatings of sufficient thickness to protect the optical fiber from inadvertent contact.

An initial experiment, using a frozen fluid optical fiber guide, cooled by chilled air at −9° C.; identified damage and strength reduction attributable to contact of the optical fiber with a fiber transport pulley. After correcting this problem, similar processing of optical fibers using a tubular reaction chamber for continuous application of diamond-like coatings showed significant improvement in retention of optical fiber strength characteristics, as shown in Table 2.

TABLE 2

Tensile Strength Testing of Diamond-Like Glass Coated Optical Fibers

| | | Tensile Strength at Failure | | |
|---|---|---|---|---|
| Condition | Identification | Maximum | Minimum | Comment |
| No ice guide | C2 | 650 kpsi | 50 kpsi | 60% below 350 kpsi<br>50% below 200 kpsi |
| Ice guide | 2 | 710 kpsi | 420 kpsi | 90% above 600 kpsi |
| Ice guide High tension | 2 | 540 kpsi | 260 kpsi | 70% above 400 kpsi |
| Ice guide Low tension | 2 | 700 kpsi | 520 kpsi | 65% above 600 kpsi |
| Ice guide Re-coated Low tension | 2 | 780 kpsi | 110 kpsi | 60% above 600 kpsi |

Comparative Example C2 includes results of strength testing of optical fibers after application of diamond-like glass coatings without the benefit of an or ice bearing to guide and protect the fiber. Several coating runs, using different optical fibers, show how uncontrolled vibration causes defects leading to low tensile strength at failure as an optical fiber passes through the stack of gas evacuation chambers used to lower the system pressure from atmospheric pressure to less than 130 Pa (1.0 torr). The pressure differential from evacuation chamber to evacuation chamber causes air motion and the resulting vibration of the fiber causes repeated contact with openings between the chambers. As explained previously, contact of stripped fiber with surfaces inside chemical vapor deposition equipment causes damage and reduction of the strength of affected optical fibers. Although coating runs were not intentionally different, output from such equipment has variable properties as shown for Example C2 that has tensile strength measurements, after application of diamond-like coatings, from as low as about 50 kpsi to about 650 kpsi. Further inconsistency of optical fiber properties is shown by 50% of test samples failing to meet a tensile strength of about 200 kpsi and about 60% of samples failing below 350 kpsi.

Example 2 of Table 2 provides an optical fiber coated with a diamond-like glass coating according to the present invention, which uses an ice bearing formed by freezing water using a thermoelectric cooler. During application of diamond-like coatings, stripped optical fibers were subjected to either a low tension of less than 50 g or a high tension exceeding 100 g. Compared to Example C2, Example 2 shows significant improvement in the consistency of optical fiber tensile strength. Low tension produces coated optical fiber of preferred consistency. Subsequent re-coating to apply a protective buffer coating (DESOTECH 3471-2-136—available from DSM Desotech, Heerlen, Netherlands) over the diamond-like coating also referred to herein as up-coating, shows evidence that this process damages the integrity of the fiber. This is shown by comparing tensile testing of up-coated optical fibers with optical fibers coated with diamond-like film under low tension. The up-coated optical fibers show greater variability with a smaller percentage achieving tensile strengths greater than 600 kpsi.

Ice bearings according to the present invention have potential in several areas. They permit bare fiber to pass from atmospheric to reduced pressures without incurring damage due to vibration induced by turbulent flow. Some vacuum processes, which may be aided by this technique, include chemical vapor deposition for metallization and diamond-like coating, as described herein, as well as high speed, reduced pressure application of acrylate compositions to optical fibers.

Frozen fluid guides also referred to as frozen fluid bearings have been described herein with particular reference to their use for facilitating application of diamond-like coatings to optical fibers preferably using a tubular plasma reactor wrapped helically by a pair of electrodes. Other variations in processes and materials, which will be appreciated by those skilled in the art, are within the intended scope of this invention as claimed below.

What is claimed is:

1. A device for forming an ion sheath in a plasma to deposit a film on a non-conducting substrate, said device cornprising:

a first chamber defining an article passageway and having an exhaust manifold;

a gas supply chamber having a gas supply manifold extealing there from, the gas supply chamber being interconnected to the first chamber such that the gas supply chamber leads into the article passageway defined by the first chamber such that the passageway provides a pathway for at least a portion of gas to pass from the gas supply chamber to the first chamber and through the exhaust manifold of the first chamber;

a second chamber defining an article passageway and having an exhaust manifold;

a gas evacuation chamber having a gas evacuation manifold extending therefrom, the gas evacuation chamber being interconnected to the second chamber such that the article passageway of the second chamber leads out of the gas evacuation chamber;

a tubular reaction chanter havine an outer surface and interconnecting the gas supply chamber and the gas evacuation chamber at locations different than the first chamber and the second chamber such that a passageway is provided for gas to enter from the gas supply chamber to the tubular reaction chamber and such that a passageway is provided for gas entering the tubular reaction rham her to pass from the tubular reaction chamber to the gas evacuation chamber and through the gas evacuation manifold; and a first electrode having a first constant width throughout its entire length, said first electrode wound helically to provide a plurality of first wraps around said outer surface of said tubaular reaction chamber; and a second electrode having a second constant width throughout its entire length that is larger than said first width, said second electrode wound helically to provide a plurality of second wraps alternating with said first wraps around said outer surface of said tubular reaction chamber, said ion sheath in said plasma forming to a thickness extending into said tubular reaction chamber at least to the longitudinal axis thereof, for ion bombardment of the non-conducting substrate, to deposit said film thereon when said first electrode has a connection to a source of radio-frequency power and said second electrode provides a path to ground.

2. The device of claim 1, wherein said tubular reaction chamber is a glass tubular reaction chamber.

3. The device of claim 1, wherein, said tubular reaction chamber has a radius less than said thickness of said ion sheath in said plasma.

4. The device of claim 3, wherein said radius of said tubular reaction chamber is less than about 25.0 mm.

5. The device of claim 3, wherein said radius of said tubular reaction chamber is less than about 12.0 mm.

6. The device of claim 1, wherein said non-conducting substrate is a filamentary substrate.

7. The device of claim 6, wherein said filamentary substrate is a glass optical fiber.

8. The device of claim 1, further cornprising:

a guide configured to guide the non-conducting substrate, the guide including a tube configured to contain a column of liquid and a cooling device configured to freeze a portion of the liquid to provide a solid collar surrounding the non-conducting substrate.

* * * * *

UNITED STATES PATENT AND TRADEMARK OFFICE
CERTIFICATE OF CORRECTION

PATENT NO.       : 7,387,081 B2
APPLICATION NO.  : 10/349844
DATED            : June 17, 2008
INVENTOR(S)      : Moses M. David It is certified that error appears in the above-identified patent and that said Letters Patent is hereby corrected as shown below:

Column 3
Line 39, delete "1 μm" and insert in place thereof -- 10 μm --.

Column 5
Line 56-67, delete "The first electrode.....path to ground." and insert the same on line 55 after "width." as the continuation of same paragraph.

Column 6
Line 53, after "exit" insert -- . --.
Line 65-66, delete the word "tetramethyl silane" and insert in place thereof
-- tetramethylsilane --.

Column 10
Line 2, after "1.5" insert -- . --.

Column 11
Line 6, delete "frozen droplet" and in place thereof -- frozendroplet --.
Line 20-32, delete "Pressure adjustment by.....chamber 18." and insert the same on line 19 after "manifolds." as the continuation of same paragraph.
Line 40-42, delete "Accelerating ions from....fiber 12." and insert the same on line 39 after "sheath." as the continuation of same paragraph.

Column 17
Line 18, delete the word "cornprising:" and insert in place thereof -- comprising: --.
Line 22, delete the word "extealing" and insert in place thereof -- extending --.
Line 22, delete "there from," and insert in place thereof -- therefrom, --.
Line 36, delete the word "chanter" and insert in place thereof -- chamber --.
Line 36, delete the word "havine" and insert in place thereof -- having --.

Column 18
Line 2, Claim 1 delete the word "rham her" and insert in place thereof -- chamber --.
Line 8, Claim 1 delete the word "tubaular" and insert in place thereof -- tubular --.
Line 23, Claim 3 after "wherein" delete ",".

UNITED STATES PATENT AND TRADEMARK OFFICE
CERTIFICATE OF CORRECTION

PATENT NO. : 7,387,081 B2
APPLICATION NO. : 10/349844
DATED : June 17, 2008
INVENTOR(S) : Moses M. David It is certified that error appears in the above-identified patent and that said Letters Patent is hereby corrected as shown below:

Line 34, Claim 8 delete the word "cornprising:" and insert in place thereof
-- comprising: --.

Signed and Sealed this

Twenty-first Day of October, 2008

JON W. DUDAS
*Director of the United States Patent and Trademark Office*